United States Patent
Zhuk et al.

(10) Patent No.: US 8,889,225 B2
(45) Date of Patent: Nov. 18, 2014

(54) CHEMICAL VAPOR DEPOSITION OF FLUOROCARBON POLYMERS

(71) Applicants: Andrew Vladimirovich Zhuk, Boston, MA (US); Neville Sonnenberg, Boston, MA (US)

(72) Inventors: Andrew Vladimirovich Zhuk, Boston, MA (US); Neville Sonnenberg, Boston, MA (US)

(73) Assignee: The Gillette Company, Boston, MA (US)

( * ) Notice: Subject to any disclaimer, the term of this patent is extended or adjusted under 35 U.S.C. 154(b) by 179 days.

(21) Appl. No.: 13/723,449

(22) Filed: Dec. 21, 2012

(65) Prior Publication Data

US 2014/0178584 A1 Jun. 26, 2014

(51) Int. Cl.
| | |
|---|---|
| *C23C 16/00* | (2006.01) |
| *B05D 1/00* | (2006.01) |
| *C23C 16/455* | (2006.01) |
| *C23C 16/46* | (2006.01) |

(52) U.S. Cl.
CPC ............ *B05D 1/60* (2013.01); *C23C 16/45568* (2013.01); *C23C 16/4557* (2013.01); *C23C 16/463* (2013.01)
USPC ..................................... 427/255.6; 427/248.1

(58) Field of Classification Search
CPC   C23C 16/45568; C23C 16/463; C23C 16/00; C23C 16/30; C23C 18/122; B05D 1/62; B05D 1/60; B05D 5/083
USPC ............................................ 427/255.6, 248.1
See application file for complete search history.

(56) References Cited

U.S. PATENT DOCUMENTS

| | | | |
|---|---|---|---|
| 3,283,117 A | 11/1966 | Holmes et al. | |
| 5,068,871 A | 11/1991 | Uchida et al. | |
| 5,433,801 A | 7/1995 | Althaus et al. | |
| 5,764,850 A | 6/1998 | Olstad et al. | |
| 5,888,591 A * | 3/1999 | Gleason et al. | 427/522 |
| 6,086,679 A | 7/2000 | Lee et al. | |
| 6,110,283 A | 8/2000 | Yamamuka et al. | |
| 6,123,993 A | 9/2000 | Xu et al. | |
| 6,165,274 A | 12/2000 | Akiyama et al. | |
| 6,331,211 B1 | 12/2001 | Xu et al. | |
| 6,458,718 B1 * | 10/2002 | Todd | 438/778 |
| 6,468,642 B1 | 10/2002 | Bray et al. | |
| 6,763,593 B2 | 7/2004 | Nakatsu et al. | |
| 6,887,578 B2 | 5/2005 | Gleason et al. | |

* cited by examiner

*Primary Examiner* — Kelly M Gambetta
(74) *Attorney, Agent, or Firm* — Kevin C. Johnson; Steven W. Miller

(57) ABSTRACT

Provided is a method for forming a fluorocarbon polymer on a surface of a structure. A feedstock gas is directed through a porous heat member having a temperature sufficient to crack the feedstock gas and produce a reactive species that includes $(CF_2)_n$ wherein n=1 or 2 radicals in the vicinity of a structure surface on which the fluorocarbon polymer is to be formed. The structure surface is maintained at a temperature lower than that of the porous heat member to induce deposition and polymerization of the $(CF_2)_n$ wherein n=1 or 2 radicals on the structure surface.

15 Claims, 1 Drawing Sheet

CHEMICAL VAPOR DEPOSITION OF FLUOROCARBON POLYMERS

FIELD OF THE INVENTION

The invention relates to a method for forming a fluorocarbon polymer on a surface of a structure, and more particularly to a method for forming a fluorocarbon polymer on a surface of a structure using a porous heat member.

BACKGROUND OF THE INVENTION

Bulk polytetrafluoroethylene, also known as, e.g., PTFE, $(CF_2)_n$, and Teflon™, is applied to blade edges to reduced cutting forces and improve shaving performance. One method to apply PTFE to a razor blade is to spray suspended fine particles of Teflon™ from a spray gun onto the blade edges. The blade edges are then sintered to melt the Teflon™ causing it to spread and adhere to the blade edges.

Chemical vapor deposition (CVD) is another method used to prepare PTFE films on surfaces of a structure. In a CVD process Teflon™ is polymerized in a vacuum system starting from a gaseous species. There are a number of techniques used to break the gaseous species down to the reactive species, $CF_2$, necessary to build the PTFE chain. The techniques include radio frequency and microwave plasmas, electron cyclotron resonance, lasers and thermal CVD. Thermal CVD uses a heated wire or an array of heated wires with relatively large spacing between the wires. During the thermal CVD process the gaseous species comes into contact with the heated wires cracking the gaseous species down to the reactive species. The reactive species then polymerizes on the surface of the substrate. The amount of the reactive species will determine the amount of solid polymer deposited on the surface of the substrate. The number of collisions between the gaseous species and the heated wires will determine the deposition rate of the reactive species on the surface of the substrate. The relatively small surface areas of the heated wires limits the deposition rate of the reactive species on the surface of the substrate.

There is a need to improve the deposition rate of the reactive species on the surface of the substrate during the CVD process.

There is a need to increase the surface area of the heated element which comes into contact with the gaseous species during the CVD process.

SUMMARY OF THE INVENTION

The present invention is directed to a method for forming a fluorocarbon polymer on a surface of a structure. The method comprises the steps of: directing a feedstock gas through a porous heat member having a temperature sufficient to crack the feedstock gas to produce a reactive species that includes $(CF_2)_n$ wherein n=1 or 2 radicals and that selectively promotes $CF_2$ polymerization, the reactive species being in the vicinity of a structure surface on which the fluorocarbon polymer is to be formed; and maintaining the structure surface at a temperature lower than that of the porous heat member to induce deposition and polymerization of the $(CF_2)_n$ wherein n=1 or 2 radicals on the structure surface.

The feedstock gas may be selected from the group of Hexafluoropropene Oxide (HFPO, CF3CF(O)CF2), $C_2F_4$, $C_3F_8$, $CF_3H$, $CF_2H_2$, $CF_2N_2$, $CF_3COCF_3$, $CF_2ClCOCF_2Cl$, $CF_2ClCOCFCl_2$, $CF_3COOH$, $CF_2Br_2$, $CF_2HBr$, $CF_2HCl$, $CF_2Cl_2$, and $CF_2FCl$; $C_3F_6$, $C_3F_4H_2$, $C_3F_2Cl_4$, $C_2F_3Cl_3$, $C_3F_4Cl_2$; $(CF_3)_3PF_2$, $(CF_3)_2PF_3$, $(CF_3)PF_4$; $(CF_3)_3P$, $(CF_3)_2P$—$P(CF_3)_2$, and $(CF_3)_2PX$, and $CF_3PX_2$, where X is F, Cl, or H, with HFPO being preferred.

The porous heat member may comprise a material having pores from about 0.01 to about 1000 micrometers in diameter. The porous heat member may comprise a material selected from the group of ceramics, metals, alloys and intermetallic compounds. The porous heat member may comprise a material selected from the group of silicon carbide, niobium, ferro-chrome, graphite, nickel-chrome, and stainless steel. The porous heat member temperature is greater than about 150° C., and wherein the step of maintaining the structure surface temperature comprises maintaining the structure surface at a temperature less than about 150° C.

The porous heat member pores may be arranged in a pattern. The porous heat member pores may be randomly arranged.

The porous heat member may be heated by passing current through the material of the porous heat member in the case of conductive ceramics and metals, inductively heating in the case of metals, or using an external heat source to maintain elevated temperatures for the heating source. The use of an external heat source will require sufficient thermal conductance and metal porous materials are the most suitable.

The structure may comprise a razor blade, surgical needles and scalpels, optical fibers, lenses, and electronic conductors.

BRIEF DESCRIPTION OF THE DRAWINGS

While the specification concludes with claims particularly pointing out and distinctly claiming the subject matter that is regarded as the present invention, it is believed that the invention will be more fully understood from the following description taken in conjunction with the accompanying drawings.

DETAILED DESCRIPTION OF THE INVENTION

The polymer thin film deposition process provided by the invention enables tailoring of the chemical composition of deposited films to produce fluorocarbon polymer thin films having stoichiometry and materials properties similar to that of bulk PTFE. The thin film resulting from the process of the present invention has improved material properties over prior thin films, which generally fail to match the material properties of bulk PTFE.

Figure 1:
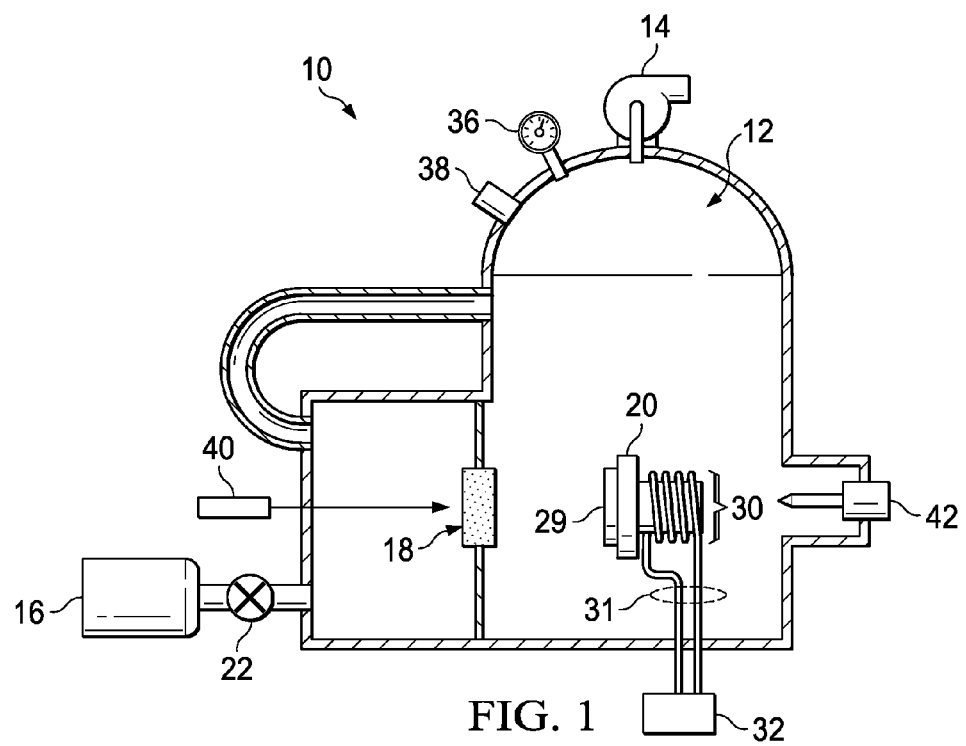
FIG. 1 is a schematic diagram of a vacuum chamber apparatus suitable for carrying out the deposition processes provided by the invention.

In accordance with the invention, a structure to be coated with a PTFE-like thin film is exposed to $(CF_2)_n$ wherein n=1 or 2 radicals under chemical vapor deposition (CVD) conditions. A deposition system like that schematically illustrated in FIG. 1 can be employed for carrying out the deposition process. As will be recognized by those skilled in the art, other conventional deposition systems can alternatively be employed. The example deposition system 10 includes an air-tight vacuum chamber 12 formed of steel, a pump 14, a feed gas source 16, a porous heat member 18, and a structure holder 20.

A flow rate controller 22 is preferably provided to enable control of the flow of gas from the feed source 16 into the chamber 12. The structure holder 20 is preferably cooled by way of a cooling system including, e.g., a coolant loop 30 connected to cooling coils 31 and a temperature controller 32, enabling a user to set and maintain a desired surface temperature by way of, e.g., water cooling.

The pump 14 is provided for evacuating the chamber to a desired pressure. The pressure of the chamber is monitored by way of, e.g., a pressure gauge 36. Also preferably provided is an analysis port 38 for enabling a user to monitor progress of the deposition process. A sensor 40 may be included to monitor the temperature of porous heat member 18. A mass spectrometer 42 may be included to monitor the mass of the particles within chamber 12.

Figure 2:
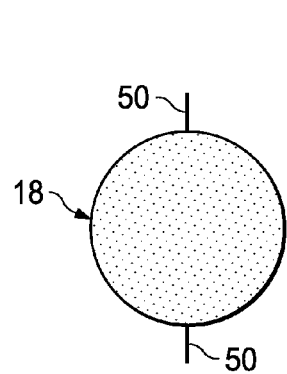
FIG. 2 is a schematic of a porous heat member of the present invention.
Figure 3:
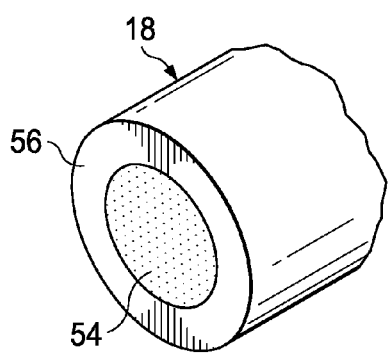
FIG. 3 is a schematic of another porous heat member of the present invention.

The porous heat member 18 is provided in a position relative to the input feed gas flow from feed gas source 16 such that the input feed gas flow is directed through the porous heat member 18; whereby the gas is pyrolyzed to produce reactive deposition species. The heat member 18 can be heated to a temperature greater than 150° C. by, e.g., resistive heating. In this case, a DC or AC voltage source may be provided to apply the heating voltage to the porous heat member 18. FIG. 2 shows a porous heat member 18 having electrical connections 50 for connecting the porous heat member 18 to a power source. FIG. 3 shows another porous heat member 18. In this design a central porous core 54 is surrounded by a heating element 56. In this case using material having sufficient conductivity such as metals for the heat member 18 is preferred.

The porous heat member 18 preferably comprises a material having pores from about 0.01 to about 1000 micrometers in diameter, and more preferably from about 1 to about 50 micrometers in diameter. The porous heat member 18 may be a material selected from the group of ceramics, metals, alloys, intermetallic compounds and combinations of these materials. The porous heat member 18 may be a material selected from the group of silicon carbide, aluminum, niobium, ferrochrome, nickel-chrome, graphite, and stainless steel.

The deposition process of the invention produces a flexible, conformal fluorocarbon coating that can be applied to a wide range of structures including complex three-dimensional geometries. Planar substrates, e.g., conventional microfabrication wafer substrates, or other planar structures, can also be singly or batch processed. Examples of substrates which may be coated include wires, neural probes, biomedical devices, razor blades, surgical needles, scalpels, optical fibers, lenses and electronic conductors.

In a single-substrate process, the substrate 29 is supported on the holder 20. In a multi-substrate process, a plurality of substrates 29 can be supported on the holder 20.

Deposition of a fluorocarbon polymer thin film provided by the invention can also be carried out on cylindrical objects such as thin cylindrical structures. For example, interconnection wires for integrated circuits, lead wires for pacemakers and other biomedical devices, and in general, any wiring structure for which a PTFE-like coating is desired, can be coated by the deposition process provided by the invention. For example, single-stranded stainless steel or copper wire, or twisted groups wires such as twisted filler wires used in pace-maker leads, can be accommodated by the process.

As will be recognized by those skilled in the art, various other support structures can be employed to accommodate a cylindrical structure during the deposition process. For example, in the case of coating of a long continuous length of wire, take-off and take-up spools can be provided to enable a continuous coating operation. Here the spools are preferably controllable such that the wire length is drawn through the deposition plasma at selected intervals corresponding to a desired coating thickness, at a continuous rate, or other desired control scheme.

Structures having geometry other than cylindrical and having a wide range of topology are also accommodated by the deposition process of the invention. For example, catheter inserts, neural probes, tubing, shaft structures, and other three-dimensional structures having multiple surfaces can be accommodated.

Other than polymer tubing, any tubing structure can be coated by the process provided by the invention. The deposition processes provided by the invention are especially well-suited for deposition on thin-walled tubing, e.g., tubing having a wall thickness of between about 1/128 inches and 1/4 inches.

As will be recognized by those skilled in the art, a support structure can be employed to accommodate a specific object to be coated in the chamber. In addition, reorientation of the object to be coated and its support structure can be enabled by, e.g., manual reorientation during the deposition process, or like the spinning wire holder ring described above, can be designed-in as a mechanism integral to the support structure. Substrate and object reorientation techniques, as are routinely employed in industrial vapor deposition processes, can correspondingly be employed in the invention to enhance deposition uniformity.

As the feedstock gas passes through the porous heat member 18 the feedstock gas is cracked to produce a reactive species that includes $(CF_2)_n$ wherein n=1 or 2 radicals that selectively promotes $CF_2$ polymerization. The reactive species are in the vicinity of structure surface 29 on which the fluorocarbon polymer is to be formed. The structure surface 29 is maintained at a temperature lower than that of the porous heat member 18 to induce deposition and polymerization of the $(CF_2)_n$ wherein n=1 or 2 radicals on the structure surface 29. The temperature of the structure surface 29 is maintained via the cooled structure holder 20.

Turning now to the processing conditions it is well-recognized that many complex physical phenomena and interactions occur in any chemical vapor deposition (CVD) environment. For example, gas molecule in-chamber residence time, gas density/chamber pressure, as well as process gas flow rate, feed gas composition, and chamber reactor geometry all directly affect the chemical processes that occur during a CVD process. Further, the surface geometry of a structure to be coated, as well as the chemical composition of the structure, and the structure's temperature, all affect the nature of the CVD process. Thus, as will be recognized by those skilled in the art, the various process parameters can be adjusted over a wide range to achieve any of a continuum of deposition process conditions. Preferably, the various parameters are controlled such that the deposition process is optimized for a given structure geometry, composition, and application.

Whatever process parameters are selected, an initial adhesion-promotion step can be employed prior to the deposition process to enhance and promote adhesion of the depositing species on a given structure. For example, an adhesion promoter can be spin-applied to a planar substrate or sprayed on to a complex geometrical object. Alternatively, an adhesion promoter can be vapor-deposited in situ in the deposition chamber just prior to the fluorocarbon polymer film deposition process. Examples of suitable adhesion promoters include 1H, 1H, 2H, 2H-Perfluorodecyltriethoxysilane; 1H, 1H, 2H, 2H-Perfluorooctyltriethoxysilane; 1H, 1H, 2H, 2H-Perfluoroalkyltriethoxysilane; perfluorooctyltriclorosilane; all classes of vinyl silanes, as well as other adhesion promoters, as will be recognized by those skilled in the art. Plasma etching or plasma chemical treatment of the surface could be also used for surface pretreatment.

It has been found that continuous plasma etching, ablation, and deposition processes result in a distribution of $CF_x$ species; only $CF_2$ groups are desired for producing a PTFE-like film, however. The process of the invention enables the ability to produce a gas of predominantly $CF_2$ species, thereby reducing the fraction of other moieties in the resulting film. The feedstock gas employed in the deposition process of the invention is also selected to maximize the $CF_2$ reaction species. In particular, the feedstock gas is selected such that the plasma gas phase decomposition product is predominantly $CF_2$. Example monomers for use as a deposition feedstock gas include $C_2F_4$, $C_3F_8$, $CF_3H$, $CF_2H_2$, $CF_2N_2$ (difluordiaxirine), $CF_3COCF_3$, $CF_2ClCOCF_2Cl$, $CF_2ClCOCFCl_2$, $CF_3COOH$, difluorohalomethanes such as $CF_2Br_2$, $CF_2HBr$, $CF_2HCl$, $CF_2Cl_2$, and $CF_2FCl$; difluorocyclopropanes such as $C_3F_6$, $C_3F_4H_2$, $C_3F_2Cl_4$, $C_2F_3Cl_3$, and $C_3F_4Cl_2$; trifluoromethylfluorophosphanes such as $(CF_3)_3PF_2$, $(CF_3)_2PF_3$, and $(CF_3)PF_4$; or trifluoromethylphosphino compounds such as $(CF_3)_3P$, $(CF_3)_2P-P(CF_3)_2$, $(CF_3)_2PX$, and $CF_3PX_2$, where X is F, Cl, or H. Other monomers can also be employed.

One preferable monomer is hexafluoropropylene oxide ($CF_3CF(O)CF_2$ or HFPO). HFPO is characterized by a highly-strained epoxide ring that enables easy ring-opening reactions with nucleophiles. It has been found that films deposited using HFPO under CVD conditions of the present invention result in polymer films having a high $CF_2$ fraction and little or no oxygen incorporation.

The selection of feedstock gas constituents should also preferably take into consideration any trace impurities that could be incorporated into a film deposited from the feedstock gas. For example, HFPO as a feedstock gas monomer can result in incorporation of trace amount of oxygen in a deposited film. Thus, if trace oxygen is not acceptable for a deposited film, a feedstock gas monomer other than HFPO is preferable. Other process parameters should likewise preferably be considered in selecting a feedstock gas monomer, as will be recognized by those skilled in the art.

The flow rate of the monomer feed gas ranges between about 1 sccm and 200 sccm, with a flow rate of about 30 sccm preferable for the monomer HFPO. Inert gases such as nitrogen or argon can be added to the monomer feedstock gas; preferably, no inert gas is included with the monomer HFPO, however.

The pressure of the vacuum deposition chamber can be set at a pressure of between about 1 milliTorr to 50 Torr during the deposition process, with a pressure of about 1 Torr being preferable. Pressure variations can result in large changes in $CF_x$ reactive species concentrations. An increase in pressure has been found to result in an increase in $CF_x$ reactive species concentrations, including $CF_2$ concentrations, which is desirable for producing PTFE-like films. The increased reactive species concentration results in correspondingly higher deposition rates.

The structure onto which a film is being deposited is held at a temperature of between about $-40°$ C. and $+200°$ C. during the deposition; preferably the temperature is held to less than about $25°$ C. The temperature that is maintained during film deposition can be an important factor for determining the ultimate thermal stability of a film produced by the deposition process. Films deposited at relatively higher structural temperatures may in some applications be relatively more resistant to heating. This is a critical property for films to be employed, e.g., as interlayer dielectric materials in microfabrication processes; such films preferably can withstand thermal treatments associated with metalization processes subsequent to their deposition.

The heater 18 and substrate 29 are preferably spaced apart by, e.g., about 0.5 cm to about 30 cm. In the example process described here, the spacing is preferably about 5 cm.

In the deposition process provided by the invention, thermal post-deposition steps can be carried out in situ in the deposition chamber. For example, a post-deposition annealing/sintering in air, or in nitrogen or other inert gas can be employed for, e.g., film stress relief, dangling bond passivation, or thermal stability enhancement. Such annealing can be carried out at a temperature of between about $50°$ C. and $400°$ C.

Fluorocarbon polymer thin films deposited pursuant to the invention are characterized as smooth, conformal, coatings that exhibit sufficient flexibility to withstand mechanical bending of a three-dimensional structure, e.g., a wire, on which they are deposited. The films exhibit materials properties that closely resemble those of bulk PTFE, thereby enabling a wide range of thin film applications that heretofore have been met with only suboptimal results.

In particular, the fluorine to carbon ratio (F/C ratio) of films provided by the invention is preferably between about 1.1-2.2; this fluorine-rich composition results in many of the well-known bulk PTFE properties. The $CF_2$ fraction of films provided by the invention are greater than about 50%, and preferably greater than about 60%. Also, the dangling bond density of films provided by the invention is very low, preferably being less than about $10^{18}/cm^3$. The films are also characterized by a low polymer crosslinking density of less than about 35%, and preferably less than about 18%. This results in increased flexibility, which in turn provides film stress relief and enables the films to withstand physical handling and exposure to environments such as biological environments. Films provided by the invention are also characterized by a dielectric constant of between about 1.4 and 1.95. This is much lower than that of previous films attempting to duplicate the dielectric properties of bulk PTFE.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

All documents cited in the Detailed Description of the Invention are, in relevant part, incorporated herein by reference; the citation of any document is not to be construed as an admission that it is prior art with respect to the present invention. To the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A method for forming a fluorocarbon polymer on a surface of a structure, comprising the steps of:
   directing a feedstock gas into a chamber and through a porous heat member comprising pores randomly arranged located within the chamber, said porous heat member having a temperature sufficient to crack the feedstock gas to produce a reactive species that includes $(CF_2)_n$ wherein n=1 or 2 radicals and that selectively promotes $(CF_2)_n$ polymerization, the reactive species being in the vicinity of a structure surface on which the fluorocarbon polymer is to be formed; and maintaining the structure surface at a temperature lower than that of the porous heat member to induce deposition and polymerization of the $(CF_2)_n$ wherein n=1 or 2 radicals on the structure surface.

2. The method of claim 1 wherein the feedstock gas comprises hexafluoropropylene oxide.

3. The method of claim 1 wherein the porous heat member comprises a material having pores from about 0.01 to about 1000 micrometers in diameter.

4. The method of claim 1 wherein the porous heat member comprises a material selected from the group consisting of ceramics, metals, alloys, intermetallic compounds and combinations of these materials.

5. The method of claim 1 wherein the porous heat member comprises a material selected from the group consisting of silicon carbide, aluminum, niobium, nickel-chrome, ferro-chrome, graphite, and stainless steel.

6. The method of claim 1 wherein the porous heat member temperature is greater than about 150° C., and wherein the step of maintaining the structure surface temperature comprises maintaining the structure surface at a temperature less than about 150° C.

7. The method of claim 1 wherein the structure comprises a razor blade.

8. The method of claim 1 wherein the structure is selected from the group consisting of surgical needles, scalpels, optical fibers, lenses, and electronic conductors.

9. A method for forming a fluorocarbon polymer on a surface of a structure, comprising the steps of:

directing a feedstock gas into a chamber and through a porous heat member comprising pores randomly arranged located within the chamber, said porous heat member having a temperature sufficient to crack the feedstock gas to produce a reactive species that includes $(CF_2)_n$ wherein n=1 or 2 radicals and that selectively promotes $CF_2$ polymerization, the reactive species being in the vicinity of a structure surface on which the fluorocarbon polymer is to be formed, the feedstock gas selected from the group consisting of $CF_3CF(O)CF_2$ (HFPO), $C_2F_4$, $C_3F_8$, $CF_3H$, $CF_2H_2$, $CF_2N_2$, $CF_3COCF_3$, $CF_2ClCOCF_2Cl$, $CF_2ClCOCFCl_2$, $CF_3COOH$, $CF_2Br_2$, $CF_2HBr$, $CF_2HCl$, $CF_2Cl_2$, and $CF_2FCl$; $C_3F_6$, $C_3F_4H_2$, $C_3F_2Cl_4$, $C_2F_3Cl_3$, $C_3F_4Cl_2$; $(CF_3)_3PF_2$, $(CF_3)_2PF_3$, $(CF_3)PF_4$; $(CF_3)_3P$, $(CF_3)_2P\text{—}P(CF_3)_2$, and $(CF_3)_2PX$, and $CF_3PX_2$, where X is F, Cl, or H; and maintaining the structure surface at a temperature lower than that of the porous heat member to induce deposition and polymerization of the $(CF_2)_n$ wherein n=1 or 2 radicals on the structure surface.

10. The method of claim 9 wherein the feedstock gas comprises HFPO.

11. The method of claim 9 wherein the porous heat member comprises a material having pores from about 0.01 to about 1000 micrometers in diameter.

12. The method of claim 9 wherein the porous heat member comprises a material selected from the group consisting of ceramics, metals, and intermetallic compounds.

13. The method of claim 9 wherein the porous heat member comprises a material selected from the group consisting of silicon carbide, niobium, ferro-chrome, graphite and stainless steel.

14. The method of claim 9 wherein the porous heat member temperature is greater than about 150° C., and wherein the step of maintaining the structure surface temperature comprises maintaining the structure surface at a temperature less than about 150° C.

15. The method of claim 9 wherein the structure comprises a razor blade.

* * * * *